United States Patent [19]

Coulmier et al.

[11] Patent Number: 4,965,584
[45] Date of Patent: Oct. 23, 1990

[54] METHOD AND DEVICES FOR TRANSLATION ALONG THE AXIS OF FREQUENCIES OF THE MODULUS OF THE TRANSFER FUNCTION OF A FILTER

[75] Inventors: Jean-Pol Coulmier, Sevres; Guy Lepere, Le Mesnil Esnard; Jacques Kunegel, Paris, all of France

[73] Assignee: Thomson CSF, Paris, France

[21] Appl. No.: 325,586

[22] Filed: Mar. 20, 1989

[30] Foreign Application Priority Data

Mar. 18, 1988 [FR] France ................... 88 03524

[51] Int. Cl.⁵ .................. G01S 13/53; G01S 13/52
[52] U.S. Cl. .................... 342/159; 342/160; 342/162; 342/203; 342/195
[58] Field of Search ............ 342/160, 162, 163, 195, 342/159, 161, 202, 203, 204

[56] References Cited

U.S. PATENT DOCUMENTS

| | | | |
|---|---|---|---|
| 3,877,010 | 4/1975 | Holberg et al. | 342/161 |
| 4,035,799 | 7/1977 | Hsiao | 342/162 |
| 4,137,532 | 1/1979 | Taylor, Jr. et al. | 342/93 |
| 4,153,899 | 5/1979 | Taylor, Jr. | 342/162 |
| 4,173,017 | 10/1979 | Burlage et al. | 342/162 |
| 4,463,356 | 7/1984 | Short, III et al. | 342/94 |
| 4,616,229 | 10/1986 | Taylor, Jr. | 342/171 |
| 4,658,255 | 4/1987 | Nakamura et al. | 342/91 |
| 4,661,816 | 4/1987 | Musha et al. | 342/91 |
| 4,694,298 | 9/1987 | Milan | 342/89 |
| 4,709,236 | 11/1987 | Taylor, Jr. | 342/101 |
| 4,783,660 | 11/1988 | Pierce | 342/101 |
| 4,839,655 | 6/1989 | Kiuchi | 342/90 X |

FOREIGN PATENT DOCUMENTS 53-484496  1/1978  Japan.
2173366  5/1985  United Kingdom.

Primary Examiner—Thomas H. Tarcza
Assistant Examiner—John B. Sotomayor
Attorney, Agent, or Firm—Cushman, Darby & Cushman

[57] ABSTRACT

The invention relates to a method for frequency-shifting the modulus of the transfer function of a transversal filter.

In a transversal filter having three delay lines Z1, Z2 and Z3 in series and four multipliers M'0 to M'3, the multiplier coefficients K0 to K3 of which are intended to eliminate the signals at frequencies in the vicinity of zero frequency and integral multiples of the repetition frequency Fr of the samples $X_i$, the method consists in replacing the multiplier coefficients K0 to K3 by coefficients K'0 to K'3 which are deduced from the first by multiplying them by fixed coefficients $e^{3jr}$, $e^{2jr}$, $e^{jr}$ and 1 with $r=2\pi Fd/Fr$.

The invention is applicable in particular to the elimination of certain undesirable echoes from radar signals.

6 Claims, 3 Drawing Sheets

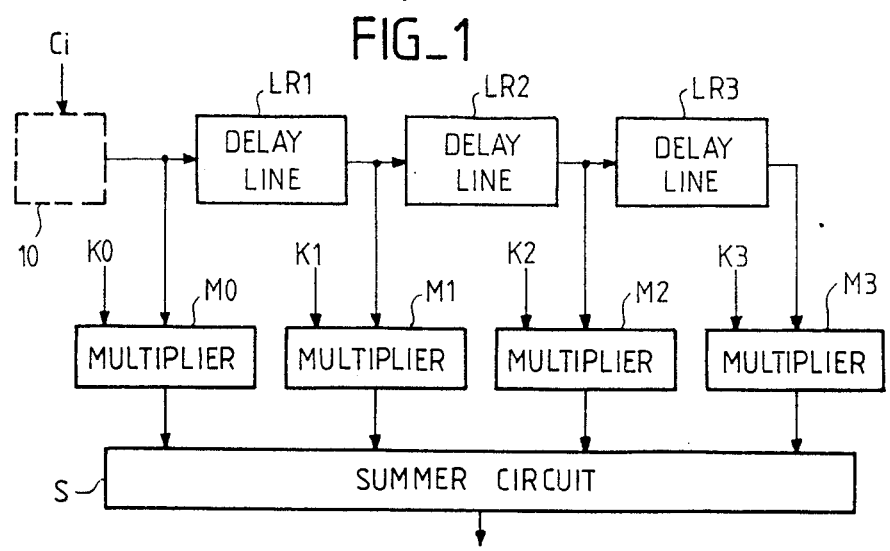
FIG_1
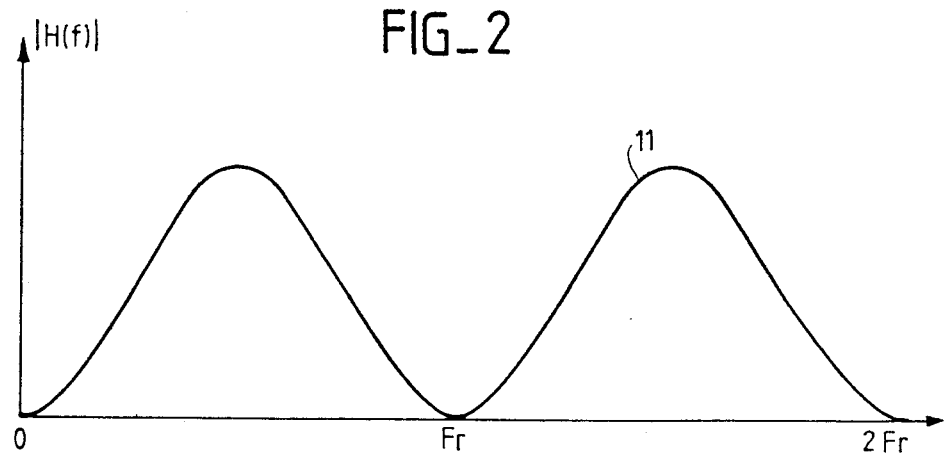
FIG_2
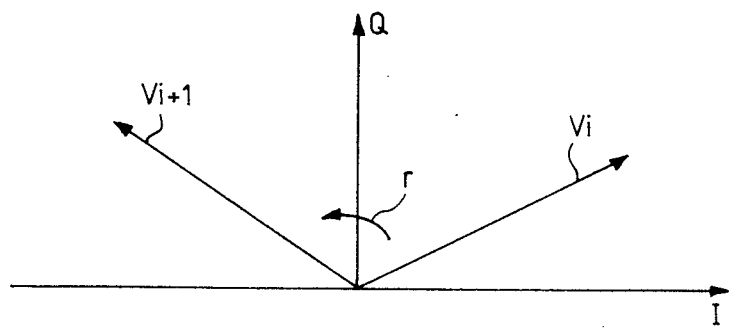
FIG_3

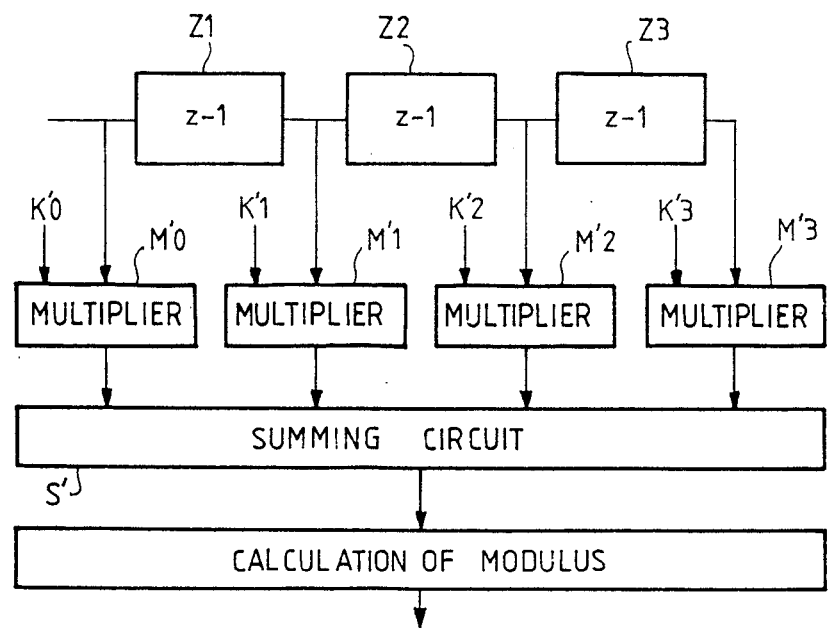
FIG_4
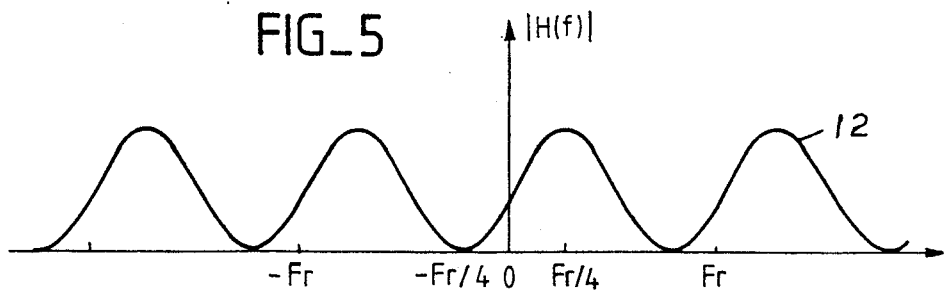
FIG_5
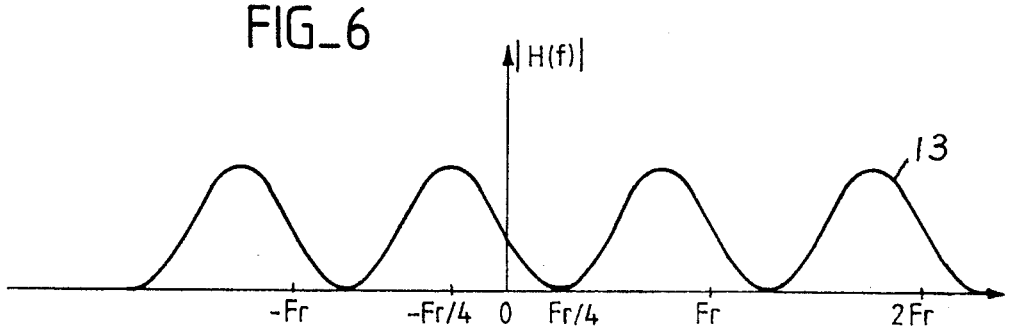
FIG_6

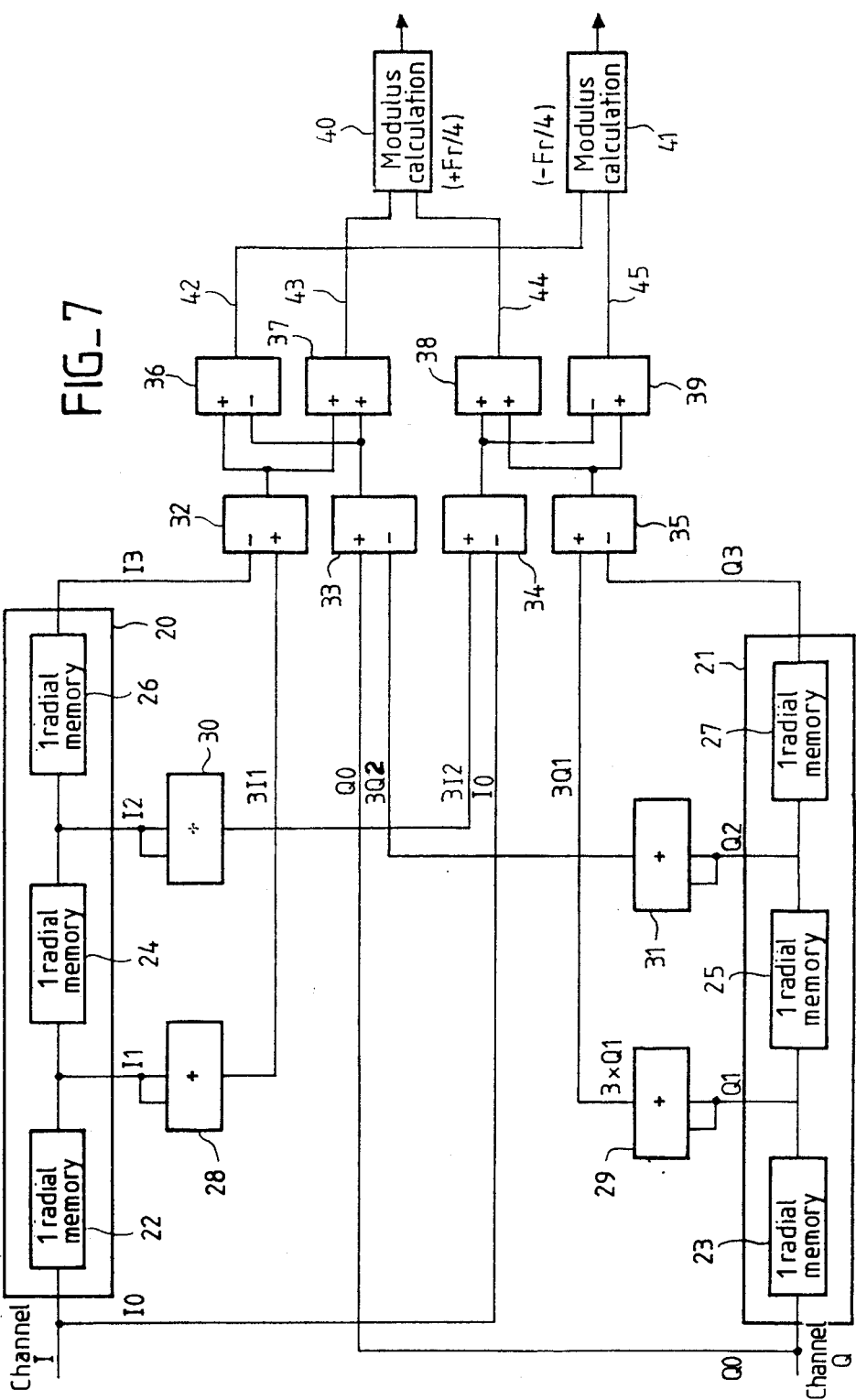

METHOD AND DEVICES FOR TRANSLATION ALONG THE AXIS OF FREQUENCIES OF THE MODULUS OF THE TRANSFER FUNCTION OF A FILTER

CROSS-REFERENCE TO RELATED APPLICATION

The subject matter disclosed hereinafter relates generally to the subject matter in copending application No. 07/321,420 now allowed.

BACKGROUND OF THE INVENTION

1. Field of the Invention

This invention relates to a method for frequency-shifting the modulus of the transfer function of a digital filter having a transversal structure and also relates to devices for carrying out said method.

Filters for the frequency of electric signals are employed in many fields of electronics and especially for processing radar signals, for example in order to eliminate fixed echoes or in order to detect echoes having predetermined characteristics such as a radial velocity. This mode of processing is employed, for example, in coherent Doppler radars having constant ambiguous velocity pulses which make it possible by virtue of the Doppler effect to detect the moving obstacles which give rise to radar signals of small amplitude in the midst of stationary obstacles corresponding to radar signals of large amplitude. In fact, in these pulse radars, the waves received after reflection from moving obstacles are affected by a phase which varies from one repetition period to the next whereas the waves received from the stationary obstacles are not subject to such a phase-shift variation. In consequence, the signals corresponding to moving obstacles have, after demodulation, components which vary sinusoidally at a frequency fd called the Doppler frequency which is related to the radial velocity v and to the wavelength e of the radar by the formula $Fd=2v/e$. The signals which correspond to stationary obstacles have a constant amplitude and their spectrum is constituted by a series of discrete lines at the frequencies 0, Fr, 2Fr, ... nFr, Fr being the repetition frequency of the emitted pulses. Moreover, the spectrum of signals corresponding to moving obstacles is composed of discrete lines of the type mFr $-+$Fd.

As may accordingly be understood, it is possible to eliminate the signals corresponding to the stationary obstacles by employing a filter for removal of fixed echoes which does not permit transmission of signals having a frequency 0, Fr, 2Fr, ... nFr. It is also desirable in certain radars such as air traffic surveillance radars to eliminate the moving obstacles which have low Doppler velocities with respect to the velocities of the echoes of interest such as clouds, for example, or else fluctuating stationary obstacles which have a certain Doppler velocity such as trees shaken by the wind. These different low-velocity parasitic echoes are better known as "clutter".

These examples show that it would be an advantage to provide in the radar field filters having a function of transfer along the axis of frequencies which could be easily and simply modified so as to eliminate not only the fixed or pseudo-fixed echoes but also those whose radial velocity is very different from that of the targets of interest.

2. Description of the Prior Art

In radars, filters are frequently designed in digital form. In other words, the signals to be filtered are sampled at a frequency equal to the repetition frequency of the pulses emitted by the radar, whereupon the amplitude of the samples is coded in order to obtain a succession of digital codes. Finally, these codes are multiplied by coefficients having values which define the characteristics of filtering to be obtained.

These so-called digital filters are formed, for example, by means of memories placed in series which record in each case the codes of all the samples of a repetition period, by means of multiplier circuits placed at the output of said memories in order to multiply the codes read from the associated memory by a suitable coefficient and by means of an adder circuit for summing the codes resulting from the multiplications.

Digital filters of this type can be employed in fields other than radar, for example in the field of high-fidelity signals, especially when such signals are in digital form. In these fields, there also exists a need to modify the transfer function of the filters on the axis of frequencies without thereby modifying the structure of the filters to any extensive degree, for example in order to extend the rejection band of the filter.

SUMMARY OF THE INVENTION

One object of the present invention is therefore to implement a method which makes it possible in a transversal filter to frequency-shift the modulus of the transfer function of said filter.

Another object of the invention is to provide devices for implementation of the method which are easy to construct in respect of certain values of the frequency shift.

The invention relates to a method for frequency-shifting by a value Fd the modulus of the transfer function of a transversal filter having n cells, the coefficients of multiplication of which are KO ..., Ki ..., Kn, the method being distinguished by the fact that it consists in multiplying the coefficient of order i by a factor $$e^{j(n-i)r}$$

with i varying from 0 to n and $$r = 2\pi Fd \cdot Tr$$

if Tr is the repetition period of the samples applied to the transversal filter so as to obtain new coefficients K'O ... K'i ... K'n.

BRIEF DESCRIPTION OF THE DRAWINGS

FIG. 1 is a schematic diagram of a transversal filter for removal of fixed echoes;

FIG. 2 is a diagram showing the modulus of the transfer function of the transversal filter of FIG. 1;

FIG. 3 is a vector diagram showing two positions of a radar signal vector in the complex plane;

FIG. 4 is a diagram of the canonical structure of a transversal filter in accordance with the invention;

FIG. 5 is a diagram showing the modulus of the transfer function of a transversal filter in accordance with the invention, which eliminates the echoes of Doppler frequencies in the vicinity of $-Fr/4$;

FIG. 6 is a diagram showing the modulus of the transfer function of a transversal filter in accordance with the invention which eliminates the Doppler frequency echoes in the vicinity of $+Fr/4$; and FIG. 7 is a diagram of construction of two transversal filters at the frequencies +Fr/4 and −Fr/4.

DESCRIPTION OF THE PREFERRED EMBODIMENTS

The invention will be described in a particular application which is that of filtering of radar signals.

In operations which involve processing of these signals, it is known to filter them, especially in order to eliminate fixed echoes, by making use of a device which is shown in the schematic diagram of FIG. 1. This device includes a plurality of delay lines such as, for example, three delay lines LR1, LR2 and LR3 disposed in series, each delay line being intended to introduce a time-delay equal to the repetition period Tr of the emitted pulses having a frequency Fr. Each delay-line output as well as the input of the first delay line LR1 is connected respectively to a multiplication or weighting circuit M0, M1, M2 and M3 in which the amplitude of the signal is multiplied or weighted respectively by a coefficient K0, K1, K2 and K3. The outputs of the multiplication circuits are connected to a summing circuit S which forms the sum of the weighted signals so as to obtain a filtered signal. In order to eliminate the fixed echoes, the values of the coefficients K0, K1, K2 and K3 can be respectively 1, −3, 3 and −1 and the frequency transfer function of a filter of this type is of the form $$|\sin \pi Fd \cdot Tr|^3$$

where Fd is the Doppler frequency of the echo. The modulus of the frequency response curve of a filter of this type is given by the diagram of FIG. 2. In the field of radars, a filter of this type is known as a transversal filter and is of the type involving cancelation on four pulses, designated as a four-pulse canceler transversal filter.

In modern radars, a filter of this type is of digital design, which means that the video-frequency signals of the radar are sampled at the frequency Fr and coded digitally in order to obtain codes Xi. These codes are recorded in memories which realize the delay lines LR1, LR2, and LR3 of FIG. 1. The multiplication circuits M0, M1, M2 and M3 as well as the summing circuit S are also realized digitally so that, in respect of a code Xi at the input of the delay line or memory LR1, a code Si is obtained at the output of the circuit S.

More precisely, at a given instant ti+3, the signal $S_{i+3}$ at the output of the summing circuit S will be given by:

$$S_{i+3} = K0 \cdot X_{i+3} + K1 \cdot X_{i+2} + K2 \cdot X_{i+1} + K3 \cdot X_i$$

where:

$X_i$ is the amplitude of the sample at the instant t of recurrence of order (i), $X_{i+1}$ is the amplitude of the sample at the instant t of recurrence of order (i+1), that is to say one period Tr later, $X_{i+2}$ is the amplitude of the sample at the instant t of recurrence of order (i+2), that is to say two periods Tr later, $X_{i+3}$ is the amplitude of the sample at the instant t of recurrence of order (i+3), that is to say three periods Tr later.

The samples $X_i$ to $X_{i+3}$ therefore correspond to a radar signal produced by a distance box located at a predetermined distance from the radar antenna which is equal to t/C if C is the velocity of light.

The objective proposed by the invention is to shift the transfer function of said filter, the frequency response of which is shown in FIG. 2, along the axis of frequencies by a value f, this shift being obtained in a simple manner with a minimum of additional means.

FIG. 3 makes it possible to understand the step involved in the present invention. In this figure, a radar signal Xi having a recurrence i can be represented in the form of a vector Vi defined by its components I and Q in the complex plane: $Xi = Ii + JQi$. At the following recurrence (i+1), the vector will have become Vi+1 and will correspond to the vector Vi o but with a rotation $r = 2\pi Fd/Fr$ if Fd is the Doppler frequency of the echo. It will accordingly be apparent that this echo would be seen as a fixed echo if, at each recurrence, it was phase-shifted through the angle r through which it would have rotated, which is equivalent to multiplying the radar signal:

$X_i$ by 1

$X_{i+1}$ by $e^{-jr}$ $X_{i+2}$ by $e^{-2jr}$ $X_{i+3}$ by $e^{-3jr}$

One will thus have obtained a frequency translation of the filter for elimination of the fixed echoes by a value Fd. One way of carrying out a translation of this type is to perform the multiplications at the input of the transversal filter of FIG. 1, that is to say by providing upstream of the delay line LR1 a multiplication circuit 10 which has been represented by a dashed-line rectangle. A solution of this type results in a multiplication circuit 10 which is fairly complex since the coefficient changes at each recurrence and which is fairly costly in the number of logic circuits and in processing time.

In the device in accordance with the invention, a multiplication circuit 10 of this type is no longer necessary and is replaced by new values K′0, K′1, K′2, and K′3 of the multiplication coefficients employed in the circuits M′0 to M′3. These values are fixed and, in the case of certain values of the frequency Fd, are easy to establish digitally.

The mathematical developments which follow are intended to determine the coefficients K′0 to K′3. To this end, recourse is had to the z transform which is, for example, defined in Chapter II of the book entitled "Les Filtres Numeriques" by R. Boite and H. Leich and published by Masson in 1980.

The z transform of a discrete time signal ($x_n$) is defined by the series:

$$\sum_{n=-\infty}^{+\infty} X_n z^{-n} \text{ denoted } Z[(X_n)]$$

In the case of a radar signal, $x_n$ corresponds to the series of samples which are separated from each other by a repetition period Tr.

The properties of the z transform make it possible to demonstrate that the transfer function H(z) of the filter of FIG. 1 (without the multiplier circuit 10) is written in the form:

$$H(z) = K0 + K1 \cdot z^{-1} + K2 \cdot z^{-2} + K3 \cdot z^{-3} \quad (2)$$

If the multiplier circuit 10 is introduced, said transfer function is written in the form:

$$Hi(z) = K0 \cdot C_{i+3} + K1 \cdot C_{i+2} \cdot z^{-1} + K2 \cdot C_{i+1} \cdot z^{-2} + K3 \cdot C_i \cdot z^{-3}$$

In this form, $C_i = (e^{jr})^i = (e^{j2\pi Fd/Fr})^i$

The modulus Hi(z) is then given by $$Hi(z) = K0 \cdot e^{j3r} + K1 \cdot e^{j2r} \cdot z^{-1} + K2 \cdot e^{jr} \cdot z^{-2} + K3 \cdot z^{-3}$$

which corresponds to a filter having a transfer function H'(z) such that $$H'(z) = K0 \cdot e^{j3r} + K1 \cdot e^{j2r} \cdot z^{-1} + K2 \cdot e^{jr} \cdot z^{-2} + K3 \cdot z^{-3} \quad (3)$$

A comparison of formulae (2) and (3) shows that, in order to achieve the frequency shift fd of the modulus of the transfer function, it is sufficient to modify the coefficients of the multiplier circuits M0 to M3 so that they become $$K'0 = K0 \cdot e^{j3r}$$

$$K'1 = K1 \cdot 19 \, e^{j2r}$$

$$K'2 = K2 \cdot e^{jr}$$

$$K'3 = K3$$

FIG. 4 gives the canonical structure of a transversal filter in the case of weighting carried out on four pulses. In this figure, the delay lines LR1 to LR3 of FIG. 1 are represented schematically by operators Z1 to Z3 in series, each of which forms the transform $z^{-1}$, which corresponds to producing a time-delay Tr of each sample $X_i$ since:

$$z^{-1} = e^{-j2\pi Fd \cdot Tr}$$

The input of the operator circuit Z1 as well as the outputs of the operator circuits Z1, Z2 and Z3 are connected to multiplier circuits M'0 to M'3 which perform respectively the multiplication by the coefficients K'0 to K'3. The outputs of the multiplier circuits M'0 to M'3 are connected to an adder circuit S' which delivers a filtered signal $S'_{i+3}$ defined by:

$$S'_{i+3} = K'0 \cdot X_{i+3} + K'1 \cdot X_{i+2} + K'2 \cdot X_{i+1} + K3 \cdot X_i$$

that is to say a signal from which the echoes having frequencies Fd have been eliminated.

The description of the invention has been made in the particular case of a transversal filter for processing four pulses but it is clear that the invention can be carried into effect in the case of any number of pulses. Thus, in the case of a number L of pulses to be processed simultaneously, we have the following z transfer functions in accordance with the structures:

(A) conventional structure for elimination of fixed echoes:

$$H(z) = \sum_{p=0}^{L} Kp \cdot z^{-p}$$

(B) structure with multiplications at the head end $$Hi(z) = \sum_{p=0}^{L} (e^{jr})^{(L-p)i} \cdot Kp \cdot z^{-p}$$

(C) structure with multiplication at the output $$H'(z) = \sum_{p=0}^{L} e^{jr(L-p)} \cdot Kp \cdot z^{-p}$$

It is accordingly observed that Hi(z) and H'(z) have the same modulus, which means that the same filtering is performed with the structure (C) as with the structure (B) if consideration is given only to the modulus but, in the structure (C), the coefficients no longer depend on the order of the sample in the repetition period and are therefore fixed values.

It is worthy of note that, for certain values of the Doppler frequency Fd with respect to the repetition frequency Fr, one obtains values of the coefficients K'0 to K'3 which are whole numbers leading to simple multiplications. This is accordingly the case when Fd is equal to $+Fr/4$ or to $-Fr/4$. In the first case, the four coefficients K'0 to K'3 can be respectively equal to one of the following four groups:

$$-(-j, 3, 3j, -1)$$

$$-(1, 3j, -3, -j)$$

$$-(j, -3, -3j, 1)$$

$$-(-1, -3j, 3, j)$$

In the second case, they can be respectively equal to:

$$-(j, 3, -3j, -1)$$

$$-(1, -3j, -3, j)$$

$$-(-j, -3, 3j, 1)$$

$$-(-1, 3j, 3, -j)$$

In the first case, the modulus of the frequency transfer function H'(f) is given by the curve 12 of FIG. 5 which corresponds to the curve 11 of elimination of the fixed echoes of FIG. 2 but displaced by $-Fr/4$ on the axis of frequencies. A transfer function of this type, the maximum value of transmission of which is at $+Fr/4$, makes it possible to eliminate the echoes corresponding to the Doppler frequencies in the vicinity of $-Fr/4$.

In the second case, the modulus of the frequency transfer function H'(f) is given by the curve 13 of FIG. 6 which corresponds to the curve 11 of elimination of the fixed echoes but displaced by $+Fr/4$ on the axis of frequencies. This transfer function, the maximum value of transmission of which is at $-Fr/4$, enables the filter to eliminate the echoes corresponding to the Doppler frequencies in the vicinity of $+Fr/4$.

FIG. 7 is a diagram of a digital filtering device for carrying out the method of the invention in the case of simultaneous frequency shifts $+Fr/4$ and $-Fr/4$ with processing on four pulses by means of three memories each forming a delay line.

The signal to be filtered is presented in the form of its two real and imaginary components I and Q respectively which are first processed in two separate channels, then within a common portion. Each separate channel has a memory 20 (or 21) which is constituted, in the case of simultaneous treatment on four samples, by three identical elementary memories 22, 24, 26 (or 23, 25, 27) each memory being intended to record, in the case of a radar signal, the codes of the samples corresponding to a repetition period Tr. The outputs of the memories 22 and 24 (or 23 and 25) are connected respectively to adder circuits 28 and 30 (or 29 and 31) which perform the operation of multiplication by the coefficient 3.

The common portion comprises adder circuits 32 to 39 and two circuits for calculation of modulus. The adder circuits 32 to 35 and 36, 39 have a (+) direct input and a (−) complementary input which forms the complement of the code which is applied thereto. More precisely, the (−) inputs of the adder circuits 32 to 35 are connected respectively:
to the output of the memory 26,
to the output of the adder circuit 31,
to the input of the memory 22,
to the output of the memory 27.

Similarly, the (+) inputs of the adder circuits 32 to 35 are connected respectively:
to the output of the adder circuit 28,
to the input of the memory 23,
to the output of the adder circuit 30,
to the output of the adder circuit 29.

Each output of the adder circuits 32 to 35 is connected to one of the two inputs of one of the adder circuits 36 to 39. Thus the output of the adder circuit 32 is connected to the (+) inputs of the adder circuits 36 and 37; the output of the adder circuit 33 is connected to the (−) input of the circuit 36 and to the (+) input of the circuit 37; the output of the circuit 34 is connected to the (+) input of the circuit 38 and to the (−) input of the circuit 31; finally, the output of the circuit 35 is connected to the (+) input of the circuits 38 and 39.

The outputs 42 and 45 of the circuits 36 and 39 are connected to the two inputs of the computing circuit of the modulus 41 and the outputs 43 and 44 are connected to the two inputs of the modulus calculation circuit 40.

If the references I0, I1, I2 and I3 respectively designate the codes of the samples at the input of the memory 22 and at the outputs of the memories 22, 24 and 26 and if the references Q0, Q1, Q2 and Q3 designate the codes of the samples at the input of the memory 21 and at the outputs of the memories 23, 25 and 27, it is apparent that we have the following codes at the output of the circuits 36 to 39:
at the output 42 of the adder circuit 36:

$$-I3+3I1-Q0+3Q2;$$

at the output 45 of the adder circuit 39:

$$-Q3+3Q1+I0-3I2;$$

at the output 43 of the adder circuit 37:

$$-I3+3I1+Q0-3Q2;$$

at the output 44 of the adder circuit 38:

$$-Q3+3Q1-I0+3I2.$$

It has been shown in the foregoing that, in order to obtain a filter known as a +Fr/4 filter, it was necessary in accordance with the invention to multiply the complex samples X3, X2, X1, X0 by the respective coefficients −1, 3j, 3, −j and to perform a summation of the results of multiplications, namely to obtain:

$$-1(I3+jQ3)+3j(I2+jQ2)+3(I1+jQ1)-j(I0+jQ0)$$

that is:

$$-I3+3I1+Q0-3Q2+j(-Q3+3Q1-I0+3I2),$$

which corresponds in the case of the real portion to the output 43 of the circuit 37 and in the case of the imaginary portion to the output 44 of the circuit 38.

In regard to the so-called −Fr/4 filter, the respective coefficients which have been indicated in the foregoing are −1, −3j, 3 and j in the case of the complex samples X3, X2, X1, X0. At the output of the summing circuit S' of FIG. 4, there is obtained:

$$-1(I3+jQ3)-3j(I2+jQ2)+3(I1+jQ1)+j(I0+jQ0)$$
namely:

$$-I3+3I1-Q0+3Q2+j(-Q3+3Q1+I0-3I2),$$
which corresponds in the case of the real portion to the output 42 of the circuit 36 and in the case of the imaginary portion to the output 45 of the circuit 39.

In consequence of the foregoing, the circuit 40 for computing the modulus therefore gives the modulus of the signal corresponding to the +Fr/4 filter whilst the circuit 41 gives the modulus of the signal corresponding to the −Fr/4 filter. The description which has just been made with reference to FIG. 7 shows that the application of the invention to particular cases of filters leads to simple digital devices which are easy to construct and make use only of elementary circuits.

The invention has been described in connection with a particular application in the field of radars. However, it is understood that the invention applies to filtering of all types of electric signals on condition that they are sampled at a frequency at least equal to twice the maximum frequency of the useful spectrum so as to obtain the samples Xi separated by time intervals equal to the sampling period.

As will be readily apparent, in order to obtain a filter having a given transfer function by implementing the present invention, it is possible to place in parallel a plurality of transversal filters in accordance with the invention and each transversal filter has a suitable transfer function in order to ensure that the sum of transfer functions finally results in the requisite global transfer function.

What is claimed is:

1. A method for frequency-shifting by a value Fd a modulus of a transfer function of a transversal filter having n cells with respective first multiplication coefficients KO ... Ki ... Kn, comprising the steps of:
applying samples having a repetitions period Tr to said transversal filter; and
multiplying each of said first multiplication coefficients Ki of order i by a factor $e^{j(n-1)r}$, wherein i varies from 0 to n and $r=2\pi Fd \cdot Tr$, to thereby provide second multiplication coefficients K'O ... K'i ... K'n.

2. A method according to claim 1, wherein the modulus of the transfer function is shifted by a frequency +Fr/4 in a three-cell transversal filter having first multiplication coefficients K0, K1, K2, K3, further comprising the step of setting said first multiplication coefficients K0, K1, K2, K3 equal respectively to 1, −3, 3, −1, to thereby provide second multiplication coefficients K'0, K'1, K'2 and K'3 having values from one of the following four groups:

$(-j, 3, 3j, -1)$ $(1, 3j, -3, -j)$ $(j, -3, -3j, 1)$ $(-1, -3j, 3, j)$.

3. A method according to claim 1, wherein the modulus of the transfer function is shifted by a frequency $-Fr/4$ in a three-cell transversal filter having first multiplication coefficients K0, K1, K2, K3, further comprising the step of setting said first multiplication coefficients K0, K1, K2, K3 equal respectively to 1, $-3$, 3, $-1$, to thereby provide second multiplication coefficients K'0, K'1, K'2 and K'3 having values from one of the following groups:

$(j, 3, -3j, -1)$ $(1, -3j, -3, j)$ $(-j, -3, 3j, 1)$ $(-1, 3j, 3, -j)$.

4. A filter for filtering a complex signal $I+jQ$ having components in a form of successive digital codes separated by repetition periods Tr, comprising:
a first channel for processing the successive digital codes of the real component I, said first channel having a first delay means such that real components I0, I1, I2, I3 of four successive digital codes are output simultaneously;
a second channel for processing the successive digital codes of the imaginary component Q, said second channel having a second delay means such that imaginary components Q0, Q1, Q2, Q3 of four successive digital codes are output simultaneously;
adder means coupled to receive the real components I0, I1, I2, I3 and the imaginary components Q0, Q1, Q2, Q3 for calculating real and imaginary portions of a first filtered signal indicative of a frequency shift $+Fr/4$ and real and imaginary portions of a second filtered signal indicative of a frequency shift $-Fr/4$, wherein Fr is the repetition frequency; and
means for calculating a modulus of the first and second filtered signals.

5. A device according to claim 4, wherein said adder means forms the following sums:

$-I3+3I1-Q0+3Q2,$ which corresponds to the real portion of the first filtered signal shifted by the frequency $+Fr/4$;

$-Q3+3Q1+I0-3I2,$ which corresponds to the imaginary portion of the first filtered signal shifted by the frequency $-Fr/4$;

$-I3+3I1+Q0-3Q2,$ which corresponds to the real portion of the second filtered signal shifted by the frequency $+Fr/4$; and $-Q3+3Q1-I0+3I2,$ which corresponds to the imaginary portion of the second filtered signal shifted by the frequency $-Fr/4$.

6. A filter according to claim 4, wherein said first and second delay means each comprise three memories coupled in series, each said memory having sufficient storage to record all the successive digital codes appearing during the repetition period Tr.

* * * * *